United States Patent
Ostrovsky et al.

(10) Patent No.: US 8,547,126 B2
(45) Date of Patent: Oct. 1, 2013

(54) SELF TESTING FAULT CIRCUIT APPARATUS AND METHOD

(75) Inventors: Michael Ostrovsky, Brooklyn, NY (US); Adam Kevelos, Coram, NY (US)

(73) Assignee: Leviton Manufacturing Company, Inc., Melville, NY (US)

( * ) Notice: Subject to any disclaimer, the term of this patent is extended or adjusted under 35 U.S.C. 154(b) by 399 days.

(21) Appl. No.: 12/845,924

(22) Filed: Jul. 29, 2010

(65) Prior Publication Data

US 2010/0295568 A1 Nov. 25, 2010

Related U.S. Application Data

(63) Continuation-in-part of application No. PCT/US2009/032502, filed on Jan. 29, 2009.

(60) Provisional application No. 61/024,199, filed on Jan. 29, 2008.

(51) Int. Cl.
*G01R 31/10* (2006.01)

(52) U.S. Cl.
USPC ..................................... 324/750.3

(58) Field of Classification Search
None
See application file for complete search history.

(56) References Cited

U.S. PATENT DOCUMENTS 1,770,398 A 7/1930 Gallop et al.
1,870,810 A 8/1932 Hoard (Continued)

FOREIGN PATENT DOCUMENTS

CA 2383738 10/2002
DE 29519212 1/1996

(Continued)

OTHER PUBLICATIONS

International Search Report for PCT/US1999/19716 filed on Aug. 31, 1999 which was published as WO 2000/14842 on Mar. 16, 2000. The International Search Report was mailed on Jan. 12, 2000.

(Continued)

*Primary Examiner* — Jermele M Hollington
(74) *Attorney, Agent, or Firm* — Foley & Lardner LLP

(57) ABSTRACT

A self testing fault circuit interrupter device comprising a fault circuit comprising at least one line monitoring circuit, at least one line interrupting circuit and at least one fault detector circuit which is configured to selectively operate said at least one line interrupting circuit when a fault is detected. This fault circuit also includes at least one test circuit configured to initiate a self test on the fault circuit and at least one timing circuit for controlling the time period for a self test being performed on said at least one self test circuit. The timing circuitry can be in the form of external circuitry which comprises a transistor which controls the discharge rate of a timing capacitor. The timing capacitor is present to prevent any false triggering of a fault circuit. A fault circuit test condition does not stop until the capacitor is fully discharged. By controlling the timing capacitor discharge rate, the triggering of an SCR is not delayed too much in the presence of an external fault because during the presence of this external fault the test cycle is considerably shortened in time based directly upon the size of the external fault. The testing circuit can include a microcontroller which can be programmed to perform a self test across at least two different half cycles of opposite polarity. The determination of the timing of the self test is based upon timing performed by the microcontroller in combination with zero crossing circuitry.

24 Claims, 6 Drawing Sheets

(56) References Cited

U.S. PATENT DOCUMENTS

| | | |
|---|---|---|
| 1,967,110 A | 7/1934 | Bergvall |
| 2,309,433 A | 1/1943 | Anderson |
| 3,252,086 A | 5/1966 | Lundstrom |
| 3,259,802 A | 7/1966 | Steen |
| 3,668,474 A | 6/1972 | Knox |
| 4,314,300 A | 2/1982 | Griffith |
| 4,455,654 A | 6/1984 | Bhaskar et al. |
| 4,707,759 A | 11/1987 | Bodkin |
| 4,742,422 A | 5/1988 | Tigges |
| 4,751,608 A | 6/1988 | Schultz |
| 5,136,458 A | 8/1992 | Durivage, III |
| 5,175,403 A | 12/1992 | Hamm et al. |
| 5,202,662 A | 4/1993 | Bienwald et al. |
| 5,214,560 A | 5/1993 | Jensen |
| 5,270,900 A | 12/1993 | Alden et al. |
| 5,309,310 A | 5/1994 | Baer et al. |
| 5,363,047 A | 11/1994 | Dresti et al. |
| 5,386,183 A | 1/1995 | Cronvich et al. |
| 5,418,678 A | 5/1995 | McDonald |
| 5,475,609 A | 12/1995 | Apothaker |
| 5,477,412 A | 12/1995 | Neiger et al. |
| 5,504,306 A | 4/1996 | Russell et al. |
| 5,600,524 A | 2/1997 | Neiger et al. |
| 5,708,548 A | 1/1998 | Greeve et al. |
| 5,715,125 A | 2/1998 | Neiger et al. |
| 5,784,753 A | 7/1998 | Kaczmarz et al. |
| 5,825,599 A | 10/1998 | Rosenbaum |
| 5,875,087 A | 2/1999 | Spencer et al. |
| 5,956,218 A | 9/1999 | Berthold |
| 5,969,920 A | 10/1999 | Mackenzie |
| 5,978,191 A | 11/1999 | Bonniau et al. |
| 5,982,593 A | 11/1999 | Kimblin et al. |
| 5,982,596 A | 11/1999 | Spencer et al. |
| 5,999,384 A | 12/1999 | Chen et al. |
| 6,052,265 A | 4/2000 | Zaretsky et al. |
| 6,052,266 A | 4/2000 | Aromin |
| 6,111,733 A | 8/2000 | Neiger et al. |
| 6,169,405 B1 | 1/2001 | Baltzer et al. |
| 6,191,589 B1 | 2/2001 | Clunn |
| 6,253,121 B1 | 6/2001 | Cline et al. |
| 6,262,550 B1 | 7/2001 | Kliman et al. |
| 6,262,871 B1 | 7/2001 | Nemir et al. |
| 6,292,337 B1 | 9/2001 | Legatti et al. |
| 6,370,001 B1 | 4/2002 | Macbeth |
| 6,421,214 B1 | 7/2002 | Packard et al. |
| 6,421,618 B1 | 7/2002 | Kliman et al. |
| 6,426,632 B1 | 7/2002 | Clunn |
| 6,426,634 B1 | 7/2002 | Clunn et al. |
| 6,433,977 B1 | 8/2002 | Macbeth |
| 6,437,700 B1 | 8/2002 | Herzfeld et al. |
| 6,456,471 B1 | 9/2002 | Haun et al. |
| 6,472,882 B1 | 10/2002 | Tiemann et al. |
| 6,502,265 B2 | 1/2003 | Gardner et al. |
| 6,522,510 B1 | 2/2003 | Finlay et al. |
| 6,532,424 B1 | 3/2003 | Haun et al. |
| 6,538,863 B1 | 3/2003 | Macbeth |
| 6,674,289 B2 | 1/2004 | Macbeth |
| 6,683,158 B2 | 1/2004 | Springer et al. |
| 6,789,209 B1 | 9/2004 | Suzuki et al. |
| 6,798,209 B2 | 9/2004 | Lavoie et al. |
| 6,807,035 B1 | 10/2004 | Baldwin et al. |
| 6,807,036 B2 | 10/2004 | Baldwin |
| 6,831,819 B2 | 12/2004 | Nemir et al. |
| 6,856,498 B1 | 2/2005 | Finlay, Sr. |
| 6,864,766 B2 | 3/2005 | DiSalvo et al. |
| 6,873,158 B2 | 3/2005 | Macbeth |
| 6,888,708 B2 | 5/2005 | Brungs et al. |
| 6,980,005 B2 | 12/2005 | Finlay, Sr. et al. |
| 7,133,266 B1 | 11/2006 | Finlay |
| 7,149,065 B2 | 12/2006 | Baldwin et al. |
| 7,154,718 B1 | 12/2006 | Finlay et al. |
| 7,173,428 B2 | 2/2007 | Hurwicz |
| 7,173,799 B1 | 2/2007 | Weeks et al. |
| 7,177,129 B2 | 2/2007 | Arenz et al. |
| 7,195,500 B2 | 3/2007 | Huang et al. |
| 7,212,386 B1 | 5/2007 | Finlay, Sr. et al. |
| 7,253,629 B1 | 8/2007 | Richards et al. |
| 7,265,956 B2 | 9/2007 | Huang |
| 7,268,559 B1 | 9/2007 | Chen et al. |
| 7,282,921 B2 | 10/2007 | Sela et al. |
| 7,289,306 B2 | 10/2007 | Huang |
| 7,295,415 B2 | 11/2007 | Huang et al. |
| 7,312,964 B2 | 12/2007 | Tchernobrivets |
| 7,315,437 B2 | 1/2008 | Bonilla et al. |
| 7,372,678 B2 | 5/2008 | DiSalvo et al. |
| 7,411,766 B1 | 8/2008 | Huang et al. |
| 7,525,402 B2 | 4/2009 | Gao |
| 7,538,993 B2 | 5/2009 | Huang et al. |
| 7,598,828 B1 | 10/2009 | Weeks et al. |
| 7,619,860 B1 | 11/2009 | Finlay et al. |
| 7,751,160 B1 | 7/2010 | Radosavljevic et al. |
| 7,843,197 B2 | 11/2010 | Finlay et al. |
| 7,986,501 B2 | 7/2011 | Kamor et al. |
| 8,081,001 B2 | 12/2011 | Hooper et al. |
| 2002/0078511 A1 | 6/2002 | Blair et al. |
| 2002/0181175 A1 | 12/2002 | Baldwin |
| 2004/0252425 A1 | 12/2004 | Baldwin et al. |
| 2005/0036250 A1 | 2/2005 | Asano |
| 2005/0063109 A1 | 3/2005 | Baldwin |
| 2005/0117264 A1 | 6/2005 | Aromin |
| 2005/0264427 A1 | 12/2005 | Zeng et al. |
| 2006/0125622 A1 | 6/2006 | Baldwin et al. |
| 2007/0014068 A1 | 1/2007 | Huang et al. |
| 2007/0030608 A1* | 2/2007 | Baldwin et al. ............... 361/42 |
| 2007/0086127 A1 | 4/2007 | Huang |
| 2007/0091520 A1 | 4/2007 | Angelides et al. |
| 2007/0146945 A1 | 6/2007 | Chen |
| 2007/0165342 A1 | 7/2007 | Elms |
| 2007/0208520 A1 | 9/2007 | Zhang et al. |
| 2007/0227506 A1 | 10/2007 | Perryman et al. |
| 2007/0279814 A1 | 12/2007 | Bonilla et al. |
| 2008/0002313 A1 | 1/2008 | DiSalvo et al. |
| 2008/0007879 A1 | 1/2008 | Zaretsky et al. |
| 2008/0012681 A1 | 1/2008 | Kadar et al. |
| 2008/0013227 A1 | 1/2008 | Mernyk et al. |
| 2008/0013237 A1 | 1/2008 | Moadel et al. |
| 2008/0013239 A1 | 1/2008 | Kopelman |
| 2008/0022153 A1 | 1/2008 | Wang et al. |
| 2009/0040667 A1 | 2/2009 | DiSalvo et al. |
| 2009/0086389 A1 | 4/2009 | Huang et al. |
| 2009/0086390 A1 | 4/2009 | Huang |
| 2009/0161271 A1 | 6/2009 | Huang et al. |
| 2010/0013491 A1 | 1/2010 | Hooper et al. |
| 2010/0073829 A1 | 3/2010 | Baxter et al. |
| 2010/0073839 A1 | 3/2010 | Baxter et al. |
| 2010/0295568 A1 | 11/2010 | Ostrovsky et al. |
| 2012/0007621 A1* | 1/2012 | Yue et al. ............... 324/750.3 |

FOREIGN PATENT DOCUMENTS

| | | |
|---|---|---|
| DE | 29600914 | 3/1996 |
| EP | 0649207 | 4/1995 |
| EP | 0677909 A2 | 10/1995 |
| FR | 2444359 | 11/1980 |
| JP | 2000-312434 | 11/2000 |
| WO | 0014842 | 3/2000 |
| WO | 2009097469 | 8/2009 |

OTHER PUBLICATIONS

International Search Report for PCT/US2009/032502 filed on Jan. 29, 2009 which was published as WO 2009/097469 on Aug. 6, 2009. The International Search Report was mailed on Jun. 29, 2009.

Non-Final Office Action for U.S. Appl. No. 11/756,362 which was mailed on Dec. 17, 2009. Response was filed on Apr. 19, 2010.

Final Office Action for U.S. Appl. No. 11/756,362 which was mailed on May 20, 2010.

Supplemental Notice of Allow ability Dated Nov. 2, 2011 for U.S. Appl. No. 12/408,229.

Notice of Allowance Dated Dec. 19, 2011 for U.S. Appl. No. 12/408,229 including search history (issued as 8,081,001).

Fairchild RV414 Low Power Ground Fault Interrupter Ref. 1.0.6 Jun. 30, 2005 www.fairchildsemi.com.

RV4145A Low Power Ground Fault Interrupter; Fairchild Semiconductor Published Dec. 7, 2004 Rev. 1.0.5.

* cited by examiner

SELF TESTING FAULT CIRCUIT APPARATUS AND METHOD

CROSS REFERENCE TO RELATED APPLICATIONS

This application is a continuation-in-part application of International Application Serial No. PCT/US09/32502 filed on Jan. 29, 2009 wherein that application claims priority from U.S. Provisional Patent Application Ser. No. 61/024,199 filed on Jan. 29, 2008 the disclosure of the international application and the provisional application both being incorporated herein by reference in their entirety.

BACKGROUND

To be commercially sold in the United States a ground fault circuit interrupter or GFCI should preferably be able to pass testing performed in accordance with the Underwriter's Laboratory UL943 standard. UL943 requires, among other things, specific fault current levels and response timing requirements at which a GFCI should trip. For example, UL943 specifies that when a GFCI is powered up and operating normally, it should trip within approximately 25 ms when a fault of about 250 ma is applied to the GFCI. UL943 trip time requirements need to be satisfied not only within the time intervals between any simulating testing but also during the time period in which a simulated test is being carried out; i.e., where an external fault is encountered during any simulated testing procedure (including right before the start of the simulated test). An external fault is an actual fault or a fault not initiated by a self test.

The trip response time of a GFCI, and therefore by extension the duration of a simulated test procedure, may depend, at least in part, on the type of ground fault detection integrated circuit or IC employed. There are two types of commonly used ground fault detection ICs available commercially. The first type is available from, e.g., National Semiconductor (e.g., LM 1851) or Fairchild T Semiconductor (e.g., FAN1 851), in addition to other alternative vendors. The other type is available from, e.g., Fairchild Semiconductor (e.g., RV4141A), and is also available from other alternative vendors.

The first type of commonly used ground fault detection IC (i.e., the LM1851, the FAN1 851, and the like) is an integrating type circuit and takes advantage of a timing curve specified in UL943 and as a result trips in accordance with the UL943 timing requirements for prescribed fault magnitudes. Use of the timing curve by ground fault detection ICs of this type generally results in a longer response time for smaller magnitude faults and a faster response time for larger magnitude faults. This variable response time is also exhibited by these types of ground fault detection ICs in the presence of simulated faults.

The other type of commonly used ground fault detection IC (i.e., the RV4141, and the like) which is a comparator circuit do not utilize the UL943 timing curve and instead have a generally small trip response time in the presence of a current level that exceeds a prescribed threshold. The typical trip response time for these types of ground fault detection ICs is 2 ms.

It is currently being considered to require automatic self testing of fault circuit interrupters.

SUMMARY

One embodiment of the invention relates to a self testing fault circuit interrupter device comprising a fault circuit comprising at least one line monitoring circuit, at least one line interrupting circuit and at least one fault detector circuit which is configured to selectively operate the at least one line interrupting circuit when a fault is detected. This fault circuit also includes at least one test circuit configured to initiate a self test on the fault circuit.

In at least one embodiment, there is at least one timing circuit for controlling the time period for a self test being performed on the at least one test circuit. The timing circuitry can be in the form of additional circuitry which comprises a transistor which controls the discharge rate of a capacitor.

In addition, in one embodiment, the testing circuit can include a microcontroller which can be programmed to perform a self test across at least two different half cycles of opposite polarity. The determination of the timing of the self test is based upon timing performed by the microcontroller in combination with zero crossing circuitry.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention. In the drawings, wherein similar reference characters denote similar elements throughout the several views.

DETAILED DESCRIPTION

Novel systems and methods utilizing suitably adapted, arranged and configured electronic circuitry in combination with a ground fault detection integrated circuit hereinafter IC and a microcontroller to enable automatically self-testing ground fault circuit interrupter GFCI devices is disclosed. Use of only a microprocessor to detect and trip the GFCI presents certain design challenges. One such challenge relates to the provision of adequate power to the microprocessor; i.e., the power supplied to the microcontroller or microprocessor must be adequate enough to allow the microcontroller to fully power up, sense a fault condition and trip the GFCI within a prescribed period of time. Properly designed combination devices, i.e., GFCI devices that have both a dedicated ground fault detection integrated circuit (IC) and a microcontroller, can overcome this challenge. In combination devices, since the ground fault detection IC is substantially operational immediately on power up and operates independently from the microcontroller. Thus, the ground fault detection IC can detect a fault and trip the GFCI within the required period of time. Therefore, while the ground fault detection IC may be employed to detect faults and trip the GFCI device within a prescribed period of time of applying power, the microcontroller can be employed to, among other things, conduct periodic self tests of the GFCI component circuitry (including, e.g., one or more of the ground fault detection IC, the circuit interrupter circuitry, etc.) thereby ensuring proper operation of the GFCI device.

Figure 1:
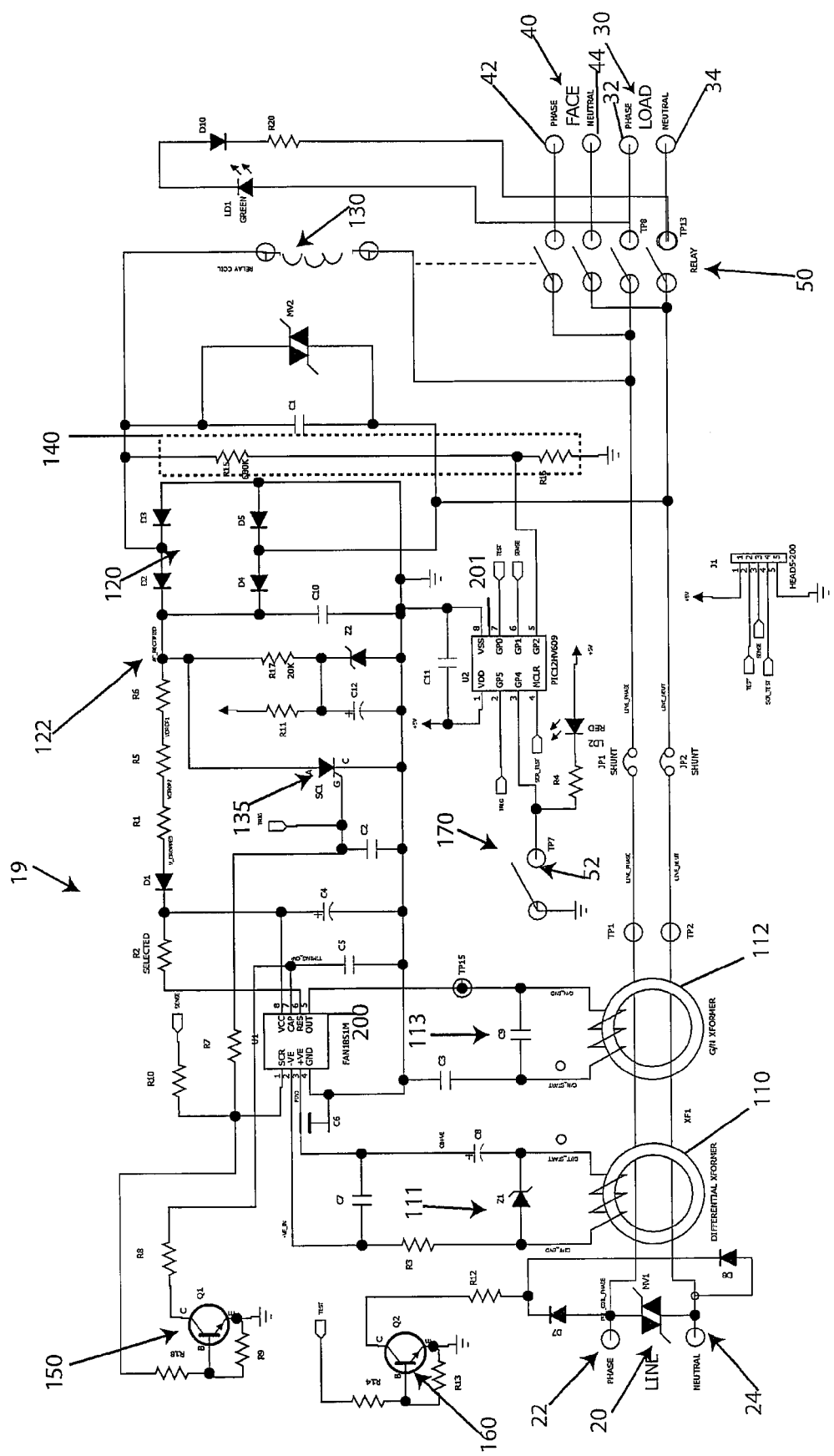
FIG. 1 is a schematic diagram of a first embodiment of the invention.
Figure 2:
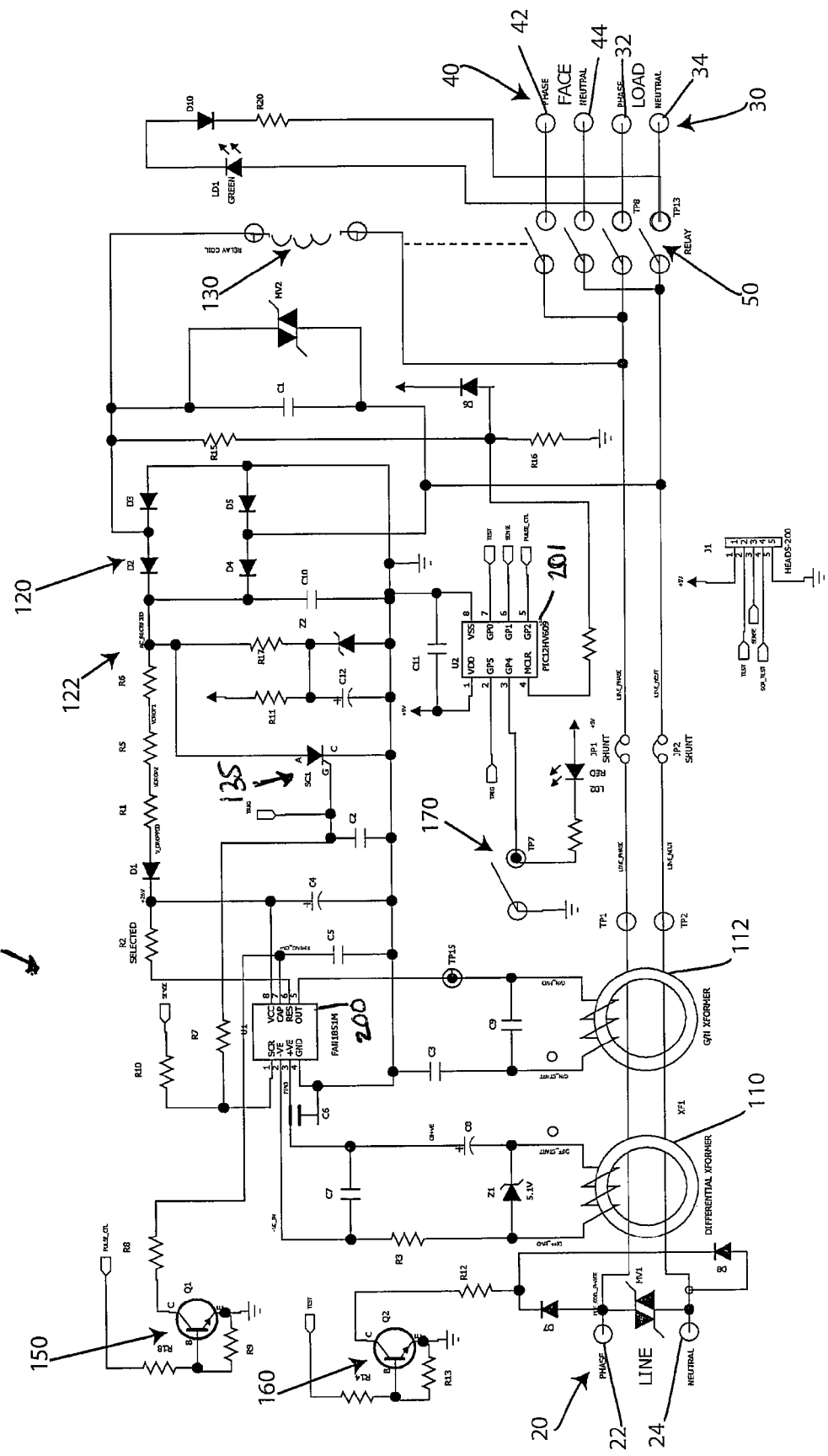
FIG. 2 is a schematic diagram of a second embodiment of the invention.

Referring in detail to the drawings, in particular FIGS. 1-2, there is shown a schematic diagram for a preferred embodiment of a fault circuit interrupter 19. In this case, there are fault detection components including a fault detection circuit 200 which in at least one embodiment is in the form of an integrated circuit manufactured by National Semiconductor (LM 1851) and Fairchild (FAN 1851) or any other suitable chip known in the art.

This fault circuit interrupter device 19 has line input connections 20 comprising a phase input 22, and a neutral input 24. There are also a load side having load output connections 30, including phase load connection 32, and neutral load connection 34. There is also a face output connection 40 including face phase connection 42 and face neutral connection 44 which in a standard single or double gang enclosure is designed to receive prongs for a plug. Disposed electrically between these input and output connections are contacts 50 which when opened, electrically isolate the line side including input connections 20 from the load side including output connections 30 and 40.

A standard GFCI design which is essentially a form of a fault circuit uses both a fault detector in the form of fault detector circuit 200 and a line monitoring circuit including at least one fault sensor. The fault sensor in at least one embodiment comprises two coils, a differential transformer 110 and a grounded/neutral transformer 112. The most basic form of a line monitoring circuit is at least one sensor which is configured to monitor a line, such as a transformer.

However, in at least one embodiment the line monitoring circuit includes differential transformer 110 which is coupled to an input circuit 111, which preferably includes a zener diode Z1, capacitors C6, C7, and C8, along with resistor R3. These components provide fault signal filtering and conditioning for the inputs into pins 2 and 3 of fault circuit 200. Grounded/neutral transformer 112 is coupled to a circuit 113 which includes capacitors C3 and C9 in a standard design which is known in the art.

A power circuit 122 for fault detector circuit 200 is preferably formed by diode D1, along with resistors R1, R5, R6 and capacitor C4 and bridge rectifier 120 including diodes D2, D3, D4, and D5. These components are the power supply for fault detector circuit 200, which is input into pin 8 of fault detector circuit 200.

In a preferred embodiment, the device also includes a capacitor C2 which provides noise protection from accidental triggering. In addition, there is an indicator LED LD1 coupled across the phase and neutral lines on the load side which indicates whether contacts 50 are closed. Indicator LED LD1 is coupled along an indicator circuit which includes any components needed to provide indication such as diode D10 and/or resistor R20.

Furthermore, in a preferred embodiment protection components in the system include capacitor C1, and metal oxide varistors MV1 and MV2. These components are protection components against high voltage power line spikes.

Under both test and non test conditions, the output of differential transformer 110 is applied between pins 2 and 3 of fault detector circuit 200 and creates a charging current through timing capacitor C5 connected to pin 7 of fault circuit 200. The level of the charging current flowing from pin 7 is directly related to the level of the fault that is input into pins 2 and 3 of fault circuit 200. Therefore, the higher the fault input current into pins 2 and 3, the higher the output charging current from pin 7. The higher the output current from pin 7, the faster the charging of timing capacitor C5.

During charging, the voltage on timing capacitor C5 grows, and when it reaches its threshoLED LD value, pin 1 on fault circuit 200 goes high, and causes triggering of SCR 135. The triggering of SCR 135 provides current to the trip solenoid 130, triggering the opening of the contacts 50 and removing the external fault from the line. Essentially, any one of the components including solenoid 130, SCR 135 and contacts 50 comprise a line interrupting circuit or disconnect device. The line interrupting circuit essentially includes an actuator, such as for example, SCR 135 which is configured to selectively disconnect contacts 50. This actuator can also include a solenoid which is triggered once the SCR is triggered. Once contacts 50 have unlatched or opened, capacitor C5 charging current disappears and it gets discharged by a current flowing across resistor R2. After the voltage on capacitor C5 goes below the predetermined voltage level, pin 1 on fault detector circuit 200 returns back to a low level. In at least one embodiment, to shorten the time period required to discharge timing capacitor C5, additional circuitry including timing circuit 150 is coupled to capacitor C5 which reduces this discharge time.

Pins 4 and 5 of fault detector circuit 200 are coupled to ground/neutral transformer 112, while pin 6 is coupled to the discharge resistor R8 and pin 8 is for receiving power input into fault detector circuit 200.

In addition, in at least one embodiment, there is a microcontroller 201 which can be used to implement a self test on fault circuit interrupter 19. This microcontroller 201 as well as microcontroller 202 (See FIG. 3) can be any suitable type microcontroller known in the art such as a suitable PIC microcontroller manufactured by Microchip or any other microcontroller from any other suitable manufacturer. The purpose of a self test is to implement automatic periodic checks of the components of fault circuit interrupter 19 and in the event of a failed self test, to trigger the solenoid, disconnecting power, and/or indicate the fault states.

Microcontroller 201 is powered by power supply circuitry including resistors R11, R17, capacitor C11 and C 12, and zener diode Z2 which supply power to pins 1 and 8. Pin 2 of microcontroller 201 is coupled to the gate of SCR 135 to control whether SCR 135 triggers. Microcontroller 201 is programmed to control three states of pin 2. The first state is a high impedance state which allows fault detector circuit 200 to control SCR 135. The second state is a low output state which blocks, hinders, shorts or shunts the input into SCR 135 which disables SCR 135. This state can also be referred to as a hinder signal, which hinders, blocks or at least partially blocks an input into SCR135 to effectively disable SCR 135. This state can be used during a self test to prevent the contacts from unlatching. In addition, microcontroller 201 can disable SCR 135 from firing around the zero crossing region to create preferential power conditions for firing solenoid 130.

The third state is an output high state which allows microcontroller 200 to trigger SCR 135. This third state can be used to trip the contacts 50 at some time period after a failure event such as at some time period after a failed self test.

In one embodiment, pin 3 of microcontroller 201 is coupled to reset button 170 so that during a manual test, microcontroller 201 initiates a test sequence similar to the automatic periodic test sequence that microcontroller 201 normally creates.

In the first embodiment shown in FIG. 1, pin 4 of microcontroller 201 is an unused pin which can be used to allow for programming of microcontroller 201. Pin 5 of microcontroller 201 is coupled to zero crossing circuitry 140 including resistors R15 and R16 as well. This zero crossing circuitry 140 allows microcontroller 201 to analyze the AC line to determine when the AC signal crosses a zero point on the line.

Because microcontroller 201 can determine the zero crossings of the AC line signal, it can output its test signal to send current to correspond with a particular half cycle as desired. With the second embodiment shown in FIG. 2, the wiring of the microcontroller is different in that pin 4 of microcontroller 201 is connected to zero crossing circuitry 140 which includes resistors R15 and R16. In addition, the output of pin 5 is coupled to base B of transistor Q1 which controls the triggering of transistor Q1 thereby allowing for the selective discharge of timing capacitor C5.

In both embodiments shown in FIGS. 1 and 2, pin 6 of microcontroller 201 is coupled to pin 1 of fault circuit 200, so that microcontroller 201 can sense when pin 1 on fault detector circuit goes high, indicating that fault detector circuit 200 has detected a fault. In this case, during a fault, either external or internal, when fault detector circuit 200 generates a fault signal, the output from fault detector circuit 200 flows not only to SCR 135 but it also flows into pin 6 of microcontroller 201 to indicate to microcontroller 201 that a fault has occurred. The input into pin 6 is significant because if during a test cycle, there is no input current or signal from pin 1 of fault circuit 200 into microcontroller 201, then this result would provide an initial indication that fault circuit 200 has failed or at least that another component monitored by the self test has failed. In a preferred embodiment, microcontroller 201 is programmed to conduct a self test over at least two different half cycles of different polarities. In at least one embodiment, these different half cycles can be consecutive half cycles. The simulated fault signals that are generated are introduced by microcontroller 201 in combination with a self test circuit such as test circuit 160 on at least a portion of a first half cycle and then on a portion of at least a second half cycle. The duration of this self test is sufficient to charge capacitor C5 to then cause the creation of a fault signal.

If after a self test cycle, which occurs across at least two different polarities of the AC line voltage, no signal is received into pin 6 of microcontroller 201, then this would indicate failure of at least one component of fault interrupter 19, e.g. fault circuit 200. Because there is testing of the fault circuit during both polarities, there would be lower likelihood of false failure indication of a self test, because the simulated fault signals occur across both polarities thereby avoiding any result of out of phase simulated fault signals being reduced or canceled out.

However, with a successful self test, timing capacitor C5 is fully charged, then pin 1 of fault circuit 200 goes high, sending a signal into pin 6 of microcontroller 201. Once this signal is received, microcontroller 201 sets a timing period for example 1-1.5 ms for the discharge of timing capacitor C5. After this period of time, microcontroller 201 reprograms pin 2 to a high impedance state, thereby removing the shunt condition, allowing SCR 135 to fire. During the presence of an external fault during a test cycle, capacitor C5 would still be charged even after the test cycle ended, thereby causing SCR 135 to fire. Alternatively, during the presence of a test cycle without the presence of an external fault, the 1-1.5 ms delay in removing the shunt, would be a sufficient time for capacitor C5 to discharge. Therefore, during a period of a self test with no external faults, even after this shunt is removed, SCR 135 would not fire.

Pin 7 of microcontroller 201 is connected to the test circuitry 160 to send out a test signal which in this case flows into base B of transistor Q2. In this case, the test circuitry can include not just the microcontroller 201, which is used to initiate test signals and to also shunt current flowing to SCR 135, but also transistor Q2 and resistors R12, R13, and R14 which form additional test circuitry. This test circuitry can also include diodes D7 and D8 which allow the test signal to occur on opposite half cycles such that diode D7 allows the test cycle to occur on a first half cycle of a first polarity while diode D8 allows the test signal to occur on a half cycle of opposite polarity.

The self test is conducted by microcontroller 201 sending a signal via pin 7 to activate transistor Q2, causing a current to selectively flow through diodes D7, and/or D8. The test fault current value is set by resistor R12. Thus, the higher the resistance of resistor R12, the lower the test fault current that is produced. When an initiating signal is applied to base B of transistor Q2, this triggers transistor Q2 so that the test current can be applied, thereby creating the appearance of a fault condition in differential transformer 110. As shown in FIGS. 1, and 2 the output of differential transformer 110 is input into pins 2 and 3 of fault circuit 200. Because the opening of transistor Q2, creates this simulated fault by allowing current to flow through resistor R12, this creates a fault current signal to be fed to pins 2 and 3 of fault circuit 200.

During a self test cycle, microcontroller 201 changes the condition state of pin 2 to the second condition state described above and hinders or blocks SCR 135 from firing, thereby preventing the unlatching of the contacts if they are latched. In addition, pin 6 of microcontroller 201 senses the voltage level on pin 1 of fault circuit 200 through resistor R 10. When a fault occurs, a fault signal is generated by fault circuit 200 so that pin 1 on this circuit goes high and microcontroller 201 senses the signal to determine that there is a fault.

Timing circuitry 150 is also utilized during the self test cycle. Timing circuitry 150 includes transistor Q1, along with resistors R8, R9, R18 to allow for a faster discharge of timing capacitor C5. This faster discharge of timing capacitor C5 creates a shorter test cycle. For example, with the first embodiment shown in FIG. 1, when pin 1 of fault circuit 200 goes high, it turns transistor Q1 on, and adds a discharge path for timing capacitor C5 through resistor R8. Using this circuitry minimizes the length of the self test time by rapidly discharging capacitor C5. Capacitor C5 only discharges when it is charged to its threshold level, so therefore this will occur once C5 is charged wherein this discharge current will then flow through resistor R8 through transistor Q1 to ground. Resistor R8 sets the discharge rate of capacitor C5 thereby controlling the time for the release of the charge from the timing capacitor.

With the second embodiment, shown in FIG. 2, base B of transistor Q1 is energized by receiving a signal into base B from pin 5 of microcontroller 201. With this second embodiment, because microcontroller 201 controls whether transistor Q1 is energized, transistor Q1 does not energize during an external fault condition and only energizes during a test fault condition.

After initiating the test, microcontroller 201 waits for a predetermined period of time to receive a fault signal from fault circuit 200. If microcontroller 201 receives a fault signal, such as when the signal on pin 1 of fault circuit 200 goes high, then microcontroller 201 determines that there was a successful self test. If microcontroller 201 does not receive a signal from fault circuit 200 within a predetermined period of time as set by microcontroller 201, then microcontroller determines that there was a failed self test. At this point, microcontroller can then in one embodiment indicate the event of a failed self test, and/or trigger SCR 135 to unlatch the contacts.

Figure 3:
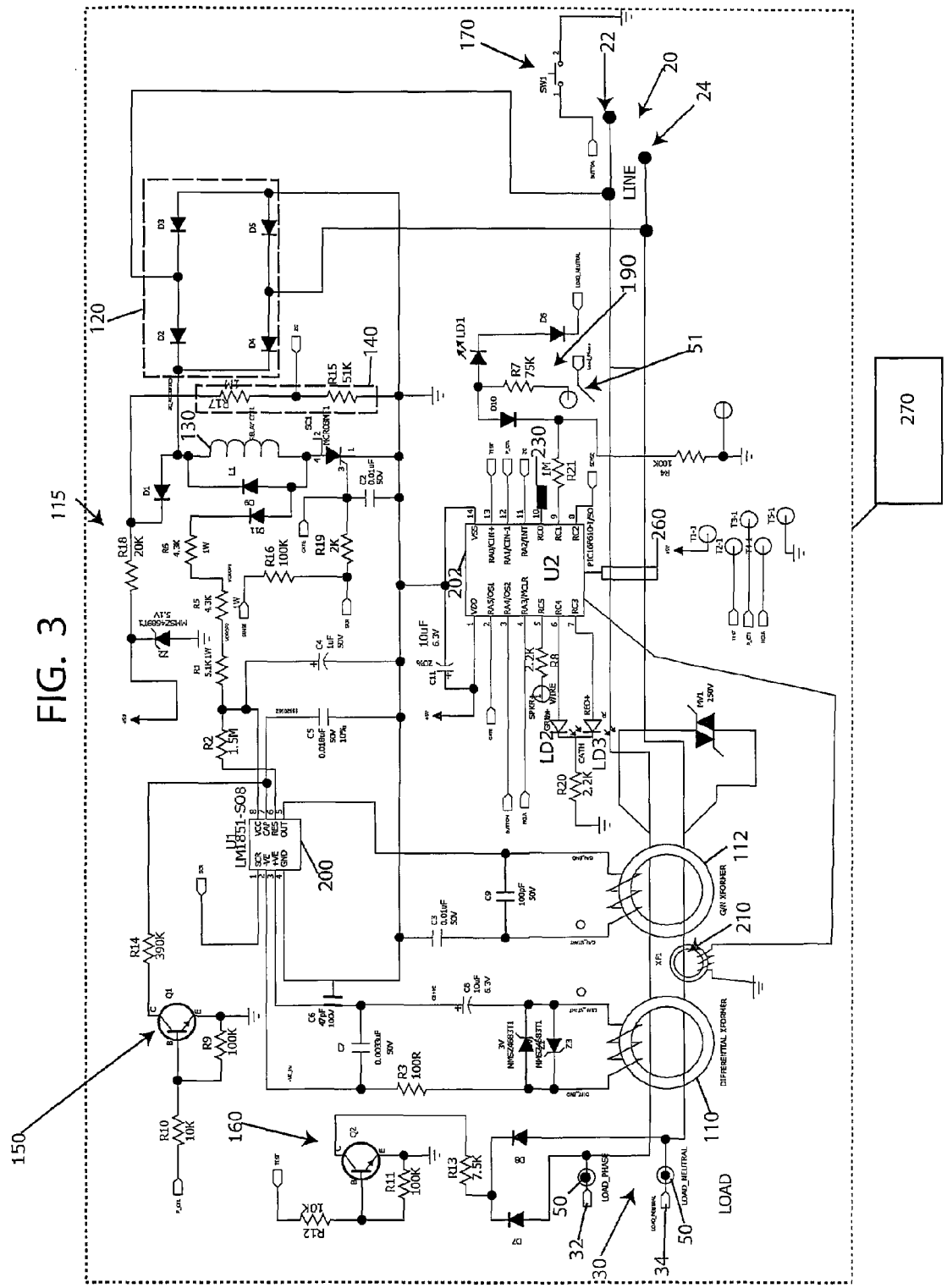
FIG. 3 is a schematic diagram of an alternative embodiment to FIGS. 1 and 2.

FIG. 3 is another embodiment of the invention which discloses a self testing fault circuit interrupter 115 which includes a line side 20 having a line side phase contact 22, and a line side neutral contact 24. There is also a differential transformer 110 and a grounded neutral transformer 112. Fault circuit 200 can be any known fault circuit but in this case is a LM1851 fault circuit as described above. Fault circuit 200 is powered by power flowing from the line side of the phase and neutral lines of the device which provide power to bridge rectifier 120. Bridge rectifier 120 comprises diodes d2, d3, d4, and d5 which provide a power supply to the components in the device such as to fault circuit 200, and microcontroller 202.

The unlatching of contacts 50 can be controlled by either fault circuit 200 in the case of an actual fault, or by the microcontroller 202 in the case of a failed self test. Thus, this device includes a circuit interrupting mechanism, which can be in the form of any known circuit interrupting mechanism but in this case, is formed by a solenoid coil 130, a SCR 135 and contacts 50. When the gate of SCR 135 receives a signal, from either pin 1 of fault circuit 200, or pin 2 of microcontroller 202, SCR 135 is triggered allowing current to flow through coil 130, causing contacts 50 to unlatch in a known manner.

There is also zero crossing circuitry 140 which is formed by resistors R15 and R17 positioned between bridge rectifier 120 and microcontroller 202. Pin 11 of microcontroller 202 has an input which reads this zero crossing circuitry 140 to determine when the AC line voltage crosses zero.

Timing circuit 150 and test circuit 160 operate in the manner discussed above in that when microcontroller 202 determines that it is time to conduct a self test, it shunts SCR 135 by reprogramming pin 2 to the second condition state to prevent a fault signal from reaching SCR 135. Next, a test signal is sent from pin 13 of microcontroller 202 to trigger transistor Q2 of test circuit 160 to create a current imbalance between the phase and neutral lines. This current imbalance is read by differential transformer 110 which then sends its output to fault circuit 200. During this self test, timing capacitor C5 is then charged, up to its threshold level, so that a fault signal is sent from fault circuit 200, wherein pin 1 of fault circuit 200 goes high. This fault signal is sensed by microcontroller 202 in pin 8 which detects when a fault signal is sent. When a fault signal is sent, timing capacitor C5 starts to discharge and then the test sequence subsequently ends.

Microcontroller 202 has a plurality of pins which in combination with the programming of the device are used to control the operation of the device. For example, pins 1 and 14 are used to receive power for powering microcontroller 202. In addition, pin 2 of microcontroller 202 is used to selectively enable or disable, or trigger SCR 135. Therefore, microcontroller 202 is programmed to change to one of the three different condition states for pin 2 as disclosed above with respect to FIGS. 1 and 2. Pin 3 is connected to the reset button 170 to read whether reset button 170 is pressed. When reset button 170 is pressed, a signal is present at pin 3 of microcontroller 202 indicating to microcontroller 202 to initiate a manual test cycle which includes a self test. However, with this design, when reset button 170 is pressed, the manual test process that is initiated does not interrupt or override the periodic self test. Pin 4 is an open pin. Pin 5 is provided to allow microcontroller 202 to control a buzzer to provide an audio indication of the result of a self test. Pins 6 and 7 are provided to control lights such as LEDs such as for example a red LED LD3 and a green LED LD2 to provide an indication of different states of the device, such as whether a self test has been successful. Pin 8 is provided for the purpose of sensing whether a fault signal has been received from fault circuit 200. For example, this pin can be used to determine whether there has been a successful self test e.g. wherein after a predetermined period of time, if pin 8 receives a fault signal from pin 1 of fault circuit 200, then this is a confirmation of a successful self test of the device.

Pin 9 is coupled to contact detector 190 and is provided to indicate whether contacts 50 are open or closed. This information can be used to determine whether contacts 50 are inoperable. For example, if an actual external fault is present, and microcontroller 202 does not detect a signal on pin 9, then microcontroller 202 can indicate that there is a problem with the device. Additionally, after a user presses reset button 170, microcontroller 202 is programmed to check the signal on pin 9, to determine whether contacts 50 are latched. Since at the start of a manual test cycle contacts 50 should be in an unlatched state, this would indicate a problem with contacts 50. Microcontroller can then indicate this problem by activating an indicator. Pin 9 is also useful in that if an audible indicator is activated due to a malfunction in the device, and contacts 50 are latched, microcontroller 202 would read whether there is a signal on pin 9. In the absence of a signal, the audible indicator would remain activated. However, upon a user subsequently pressing the test button, i.e. mechanically unlatching contacts 50, a signal would then be present on pin 9 of microcontroller 202. Microcontroller 202, could be programmed in such an event to deactivate the audible indicator.

Pin 10 can be used to connect to a temperature sensor 230. Temperature sensor 230 can comprise a circuit utilizing a resistor, a thermistor, or any other known sensor circuitry for determining the ambient temperature of the device. If necessary, microcontroller 202 can include an additional pin to connect to this temperature sensor to form a closed circuit. The temperature sensor is used to determine the ambient temperature of the device, wherein microcontroller 202 includes programming to trip the contacts in the event it detects that an operating temperature, or an ambient temperature sensed by temperature sensor 230 is too high or too low.

Pin 11 is provided to read a zero crossing signal from zero crossing circuitry 140. This zero crossing circuitry 140 is used for timing and synchronization, and is also used to detect an overvoltage and an undervoltage condition. This occurs by reading a signal through resistor R17. Pin 12 is provided to control the timing control circuit 150, while pin 13 is provided to initiate a self test on testing circuit 160. Additional optional components can be used to connect to any open pins. One of these optional components includes a current transformer 210 which in this embodiment, is shown connected across the neutral line, but in another embodiment can be coupled across the phase line and/or the neutral line to determine the level of current flowing through the system. In this case, in at least one embodiment, microcontroller 202 includes pre-set operating parameters which are used to determine whether the device is operating in a particular current range. If the current is either too low, or in the alternative, too high, microcontroller 202 can then determine the existence of this condition. In at least one embodiment of the device, the microcontroller would then indicate this overcurrent condition via indication, such as through a buzzer or lighting a light such as LED LD2 or LED LD3. In another embodiment, the microcontroller 202 would indicate this condition by both tripping the contacts 50 thereby cutting off power to the load side of the device, and also providing indication such as through an annunciator such as a buzzer, or speaker, or through a light such as through LED LD2 or LED LD3. Thus, in at least one embodiment the microcontroller forms an overcurrent detector.

Another optional component connected to microcontroller 202 is a fuse 260. Fuse 260 is coupled to microcontroller 202 at one end and either to both the phase and neutral lines of the line side, to the phase line only, or to the neutral line only. Fuse 260 can be in the form of a fusable link, a thermal cut out, a trace on a PC board, or a similar component known in the art. Fuse 260 can be selectively burned out to open the path along the phase line and/or neutral line to create an open circuit when microcontroller 202 determines that the device should be permanently taken off line. This device can therefore further include a heating element such as a resistor or other known heating elements which can be used to burn fuse 260 out.

Another optional component that can be connected to microcontroller 202 is a transceiver 270, which is coupled to an open pin of microcontroller 202. Transceiver 270 can communicate using any known communication means such as RF, infrared, powerline communication, wired communication including RS485, Ethernet, CAN, or any other known wired or wireless communication. If transceiver 270 is a RF transceiver, it can use any mesh network protocol including ZWAVE, ZIGBEE. The communication can be over a local area network (LAN), wide area network (WAN), or personal area network (PAN).

The RF transceiver is used to allow microcontroller 202 to communicate with external devices. This communication can allow microcontroller 202 to provide external indication of the self test, the trip state or any other condition, to be remotely tripped, to send data relating to parameters associated with the device such as temperature. The transceiver can be either external to the microcontroller or integrated into the microcontroller.

The microcontroller can also be programmed to determine when there is an overvoltage condition. In this case, the microcontroller reading the zero crossing circuitry through pin 11 determines the timing of the zero crossing to determine whether the device is experiencing an overvoltage condition. If the slope of the zero crossing line (AC line voltage) is more steep than during normal operating conditions, then microcontroller 202 would read that there is an overvoltage condition. If the slope of the zero crossing line readings (AC line voltage readings) it is less steep than normal operating conditions, then microcontroller 202 would read that there is an undervoltage condition. At this point, the microcontroller would then determine whether to indicate this condition, and/ or selectively trip contacts 50, and/or permanently take the device off line by opening the fusable contacts 260.

As discussed above, the polarity and timing of zero crossing is detected with the help of the zero crossing circuitry 140 including resistors R15, and R17. If a self test was conducted during the existence of an external fault that was below a trip limit, then this condition could result in a false failure of a self test. Because the device as disclosed in the embodiments shown in FIGS. 1-3, is configured to conduct the self test across at least two different half cycles of opposite polarity, this self test is not affected by the presence of a standing external fault. This is because with these embodiments shown in FIGS. 1-3, the self test simulated fault signal is a rectified fault signal as described below and shown in FIG. 4B.

If during the self test, pin1 of microcontroller 202 goes high at the half cycle or during a period of time when a test fault is not applied, this means that an external fault caused the tripping and microcontroller 202 will unblock the SCR 135 to allow the GFCI chip to trip the solenoid.

Figure 4A:
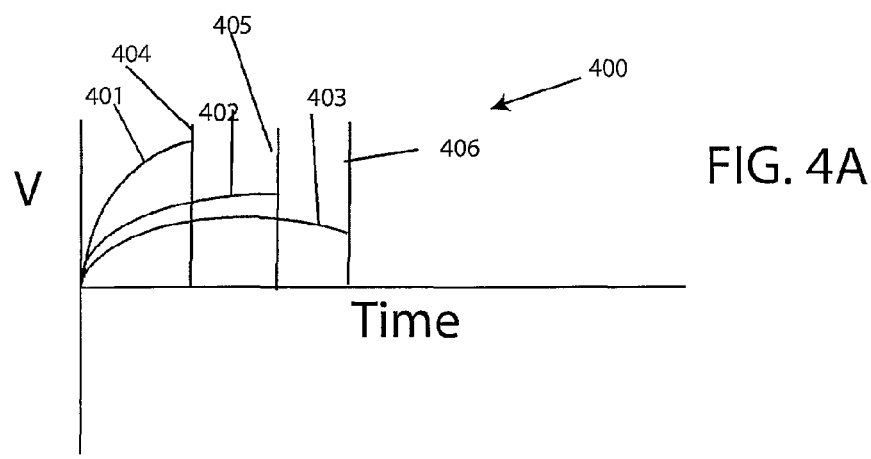
FIG. 4A is a graph of different simulated fault signal durations based upon voltage level as function of time.

FIG. 4A discloses a graph 400 showing three different curves 401, 402, 403 of a portion of a rectified simulated fault signal, with the voltage plotted vs. time showing that microcontroller 202 can adjust the time for conducting the self test based upon the voltage provided by the AC source. In this case, this allows for the adjusting of the root mean square or RMS of the simulated fault current. Therefore, because microcontroller 202 can control this RMS, it can keep the RMS constant regardless of the source voltage variations. In this way, microcontroller 202 can control the time period for the self test. The vertical lines 404, 405, and 406 represent the time duration for each simulated fault signal that is generated. As shown, if the voltage is lower such as with curve 403, than with curve 401, then the time duration for each self test signal is longer. This adjustment by microcontroller 202 creates a self adjusting system for a constant RMS value for each simulated fault signal.

Figure 4B:
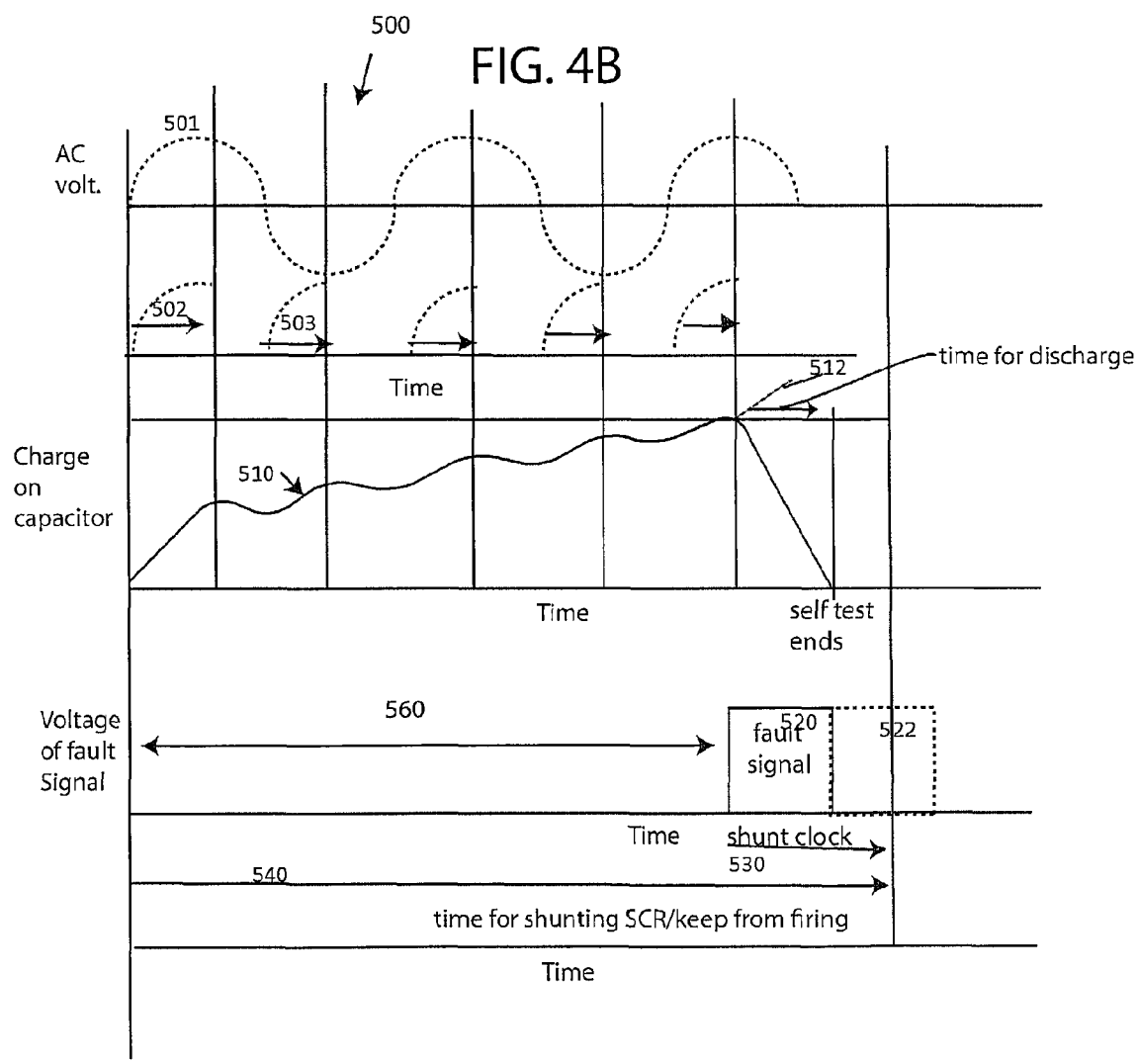
FIG. 4B is a graph of a series of events occurring during a self test vs. time.

FIG. 4B shows a series of graphs 500 having at least one common axis. For example, each one of these graphs shows the time period along the X axis which indicates an AC line signal, when a self test signal is sent, the associated charge level on capacitor C5 and the time period for the creation of the fault signal as well as the full time period for the self test, including the time period for shunting SCR 135 or taking SCR 135 offline.

For example, curve 501 shows a standard AC line signal. Arrows 502 and 503 represent the time duration of each simulated fault signal during a self test. Each of these arrows is associated with a portion of a rectified simulated fault signal generated by the testing circuitry, such that the simulated fault signal is present on both polarities of the AC line signal. For example, arrow 502 represents a simulated fault signal that is generated on a positive half cycle, and arrow 503 represents a simulated fault signal that is generated on a negative half cycle of the AC line signal. This view shows that the self test is conducted across approximately ½ of each half cycle which results in the charging of capacitor C5 resulting in an increase in charge built up in this capacitor until a threshold amount is accumulated and then when the charge capacity of capacitor C5 is reached, a fault signal as shown by pulse 520 is created, resulting in pin 1 of fault circuit 200 going high. While, approximately Vi of each half cycle is shown, any suitable duration can be used as shown above in FIG. 4A. There is shown an associated curve 510 for the charging of timing capacitor C5. Once capacitor C5 reaches its threshold level, this normally causes a signal on pin 1 of fault circuit 200 shown by pulse 520. This signal passed to SCR 135 which would ordinarily trip SCR 135. However, in this case, SCR 135 is shunted as described above, so that the contacts do not trip.

Microcontroller 202 is programmed to validate whether a fault signal that is detected during a self test cycle is created by a simulated fault signal from the self test or an external fault. Microcontroller 202 determines whether the fault signal occurs before an expected time following the start of the self test. If the fault signal occurs too early, such as during timing region 560, microcontroller 202 determines that an external fault is present and microcontroller changes the state of pin 2 to allow SCR 135 to fire prior to the natural expiration of the shunt clock shown as reference numeral 530. Shunt clock 530 is the time period calculated by microcontroller 202 that would be sufficient to prevent SCR 135 from firing during a self test. This shunt clock is started by microcontroller 202 once microcontroller 202 receives a fault signal from fault circuit 200.

If the microcontroller determines that the fault signal occurs within an expected time window such as window or timing region defined by pulse 520 of FIG. 4B, then microcontroller 202 analyzes the point within the half cycle when the fault was generated. If the detected fault signal was generated during the time of an application of a simulated test fault, then this is in the range of an acceptable self test. If it wasn't then this is an indication of an external fault and microcontroller 202 stops shunting SCR 135 prior to the expiration of the shunt clock.

Once the shunt clock has expired, this causes microcontroller 202 to change the state of pin 2 to remove the shunt from the gate of SCR 135. In the event that the fault signal extends beyond the time period for the self test/expiration of the shunt clock, then this fault signal would then activate SCR 135 causing the opening of contacts 50. This is shown by the dashed line 522 which extends beyond the self test fault signal 520. Dashed line 512 also shows that capacitor C5 also remains charged up to its threshold level thereby allowing the continuation of this fault signal.

Figure 5:
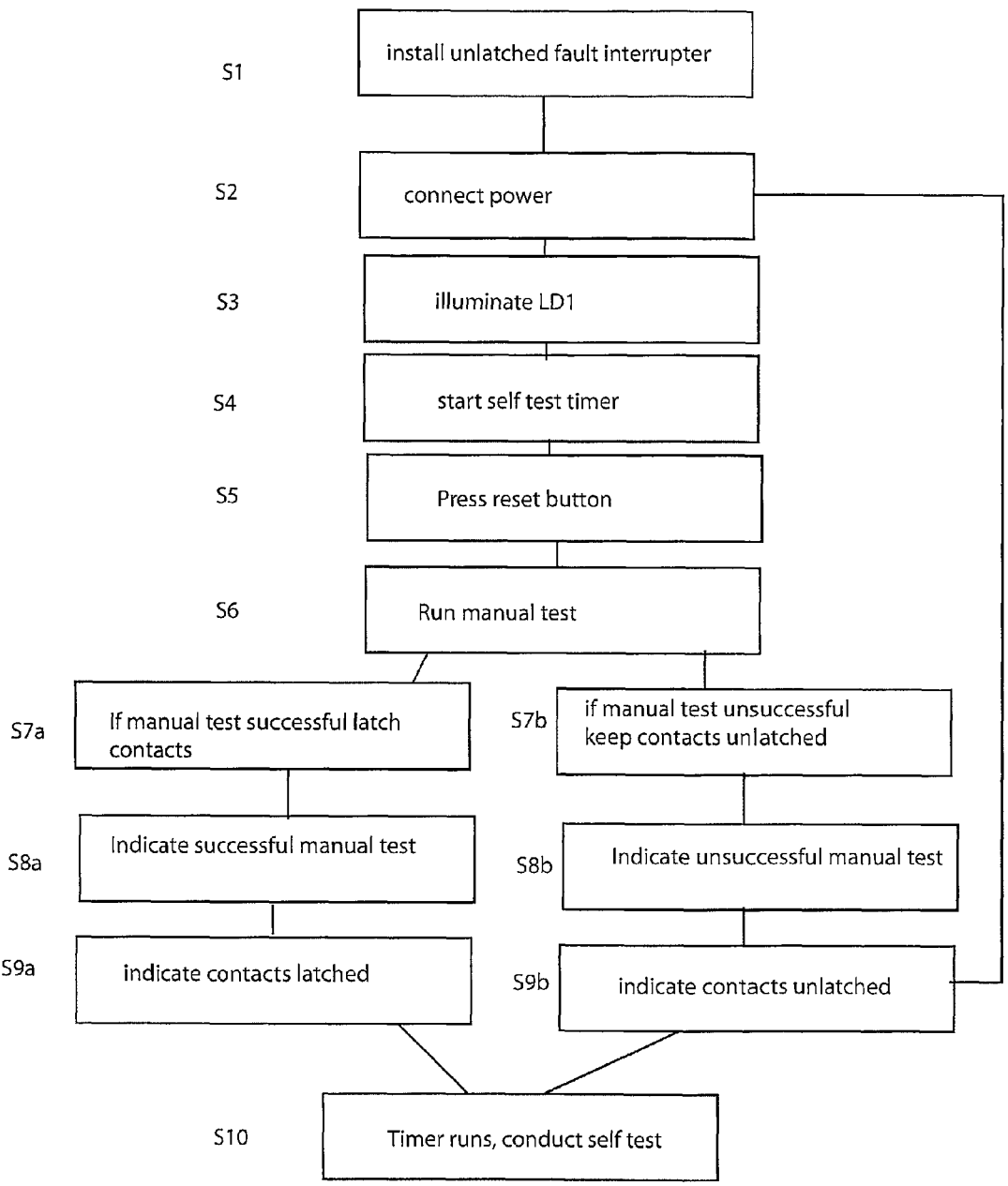
FIG. 5 is a flow chart illustrating one embodiment of the process for installing the self test device and conducting a manual test.

FIG. 5 is a flow chart for one preferred process for installing the device and conducting a manual test. For example, step S 1 includes installing an unlatched fault circuit interrupter. Step S2 involves connecting the fault circuit interrupter to power. This step can be in any known suitable manner, which can for example include connecting the line side of the phase and neutral contacts to the phase and neutral lines of a power distribution line. In step S3 LED LD1 would receive power thereby illuminating in at least one embodiment, a yellow light.

Next, in step S4, microcontroller 202 would start a self test timer to count down to when an automatic self test would occur. In this case, the first automatic self test could occur within 5 seconds of installing the device. Subsequent self tests could occur every 5 seconds, or at a different scheduled rate such as every fifteen minutes, every three hours, every five days or any other desired time period. In addition, in at least one embodiment, microcontroller 202 is programmed to schedule the self test at a progressively decreasing rate such as first after five seconds, then once again after five minutes, and then once that test is completed, once every five hours, and then after one or a series of five hour self tests, once every five days, etc. The decreasing rate may be possible because it may not be necessary to test as frequently, once the microprocessor has successfully completed a first series of self tests because most self test failures occur in the beginning installation time due to miswiring, electrical surges, or broken components. Next in step S5 a user would press a reset button. As described above, the pressing of a reset button initiates a manual self test. The pressing of the reset button provides an input into microcontroller 202 to start a self test cycle in step S6 which is disclosed in greater detail in FIG. 6. In step S7A if the manual test cycle is successful, the contacts can latch allowing power to the load and face contacts. In addition, the process would proceed to step S8A wherein microcontroller 202 would indicate in LED LD2 that there was a successful manual test, providing a green indication light. In addition, once the contacts have latched, in step S9a, LED LD1 would lose power thereby indicating that there are latched contacts. Finally, during this manual test cycle, the timer on microcontroller 202 runs resulting in the eventual start of a self test.

Alternatively, if the manual test fails, in step S7b the contacts remain unlatched and locked out. Next, in step S 8b microprocessor 202 would provide power to LED LD3 that the manual test has failed. In addition, in step S9b, the state of LED LD1 would remain in the lit condition because the contacts would remain unlatched.

Figure 6:
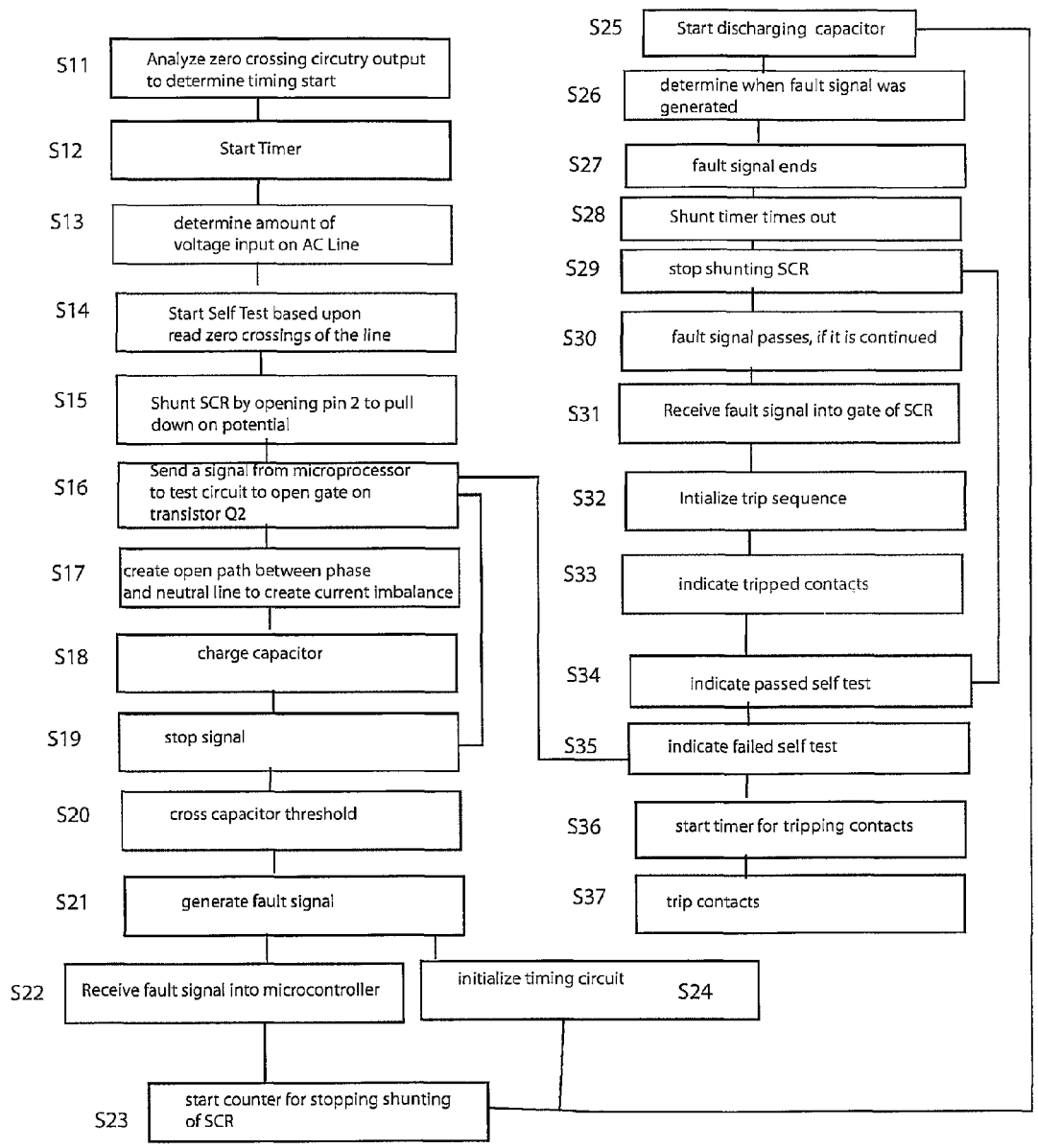
FIG. 6 is a flow chart illustrating one embodiment of the process for conducting an automatic self test.

FIG. 6 is the flow chart for one preferred process for conducting a self test. Once microcontroller 202 analyzes the zero crossing circuitry in step S11, it starts a self test timer in step S 12. Next, in step S 13, the device determines the amount of voltage input into the AC line which continues constantly throughout the process. Next, in step S 14 microcontroller 202 initiates a self test after the predetermined period of time, which is calculated by reading the zero crossings of the AC line signal. The first step in the self test involves step S 15 which includes shunting an SCR such as SCR 135 as discussed above. Next, step S 16 involves sending a signal from microcontroller 202 to test circuit 160 to open the gate on test circuit 160 to create a open path in step S 17 between the phase line and neutral line to create a current imbalance. This current imbalance is read by fault circuit 200 wherein timing capacitor C5 is then charged with this fault signal and any successive simulated fault signals until it reaches its threshold value. Microprocessor 202 cycles through steps S 16-S19 to create periodic self tests on half cycles of opposite polarity until a timing capacitor such as capacitor C5 reaches its charge threshold in step S20.

Next, in step S20 once the capacitor threshold has been crossed, a fault signal is generated in step S21. In step S22 this fault signal is received into microcontroller 202, which then in step S23, starts an internal counter or clock in microcontroller 202 to stop the shunting of SCR 135. As described above, this shunt clock would continue for a predetermined period of time which would be considered a sufficient period of time for timing capacitor C5 to discharge. Because of the incorporation of timing circuit 150, the time for timing capacitor to fully discharge can be controlled, and in this case, reduced so that there is less time required for putting the fault circuit back online for detecting actual faults once a self test has completed. Therefore step S24 includes the step of initializing a timing circuit such as timing circuit 150. The initialization of timing circuit 150 starts the discharge of capacitor C5 in step S25. In addition, in step S26 microcontroller determines when the fault signal was generated. As described above, the timing of the generation of a fault signal is significant because if a fault signal is either generated too early for a normal self test, or generated during a period of time when there was no simulated fault signal being applied thus charging capacitor C5 alone, then microcontroller 202 records this as evidence of an actual fault and then ends the shunting of SCR 135 prior to the shunt timer timing out, and thereby allows tripping of the contacts.

If microcontroller 202 determines that the fault signal was not generated too quickly, or during a period of time when no simulated fault signal is produced, then during a normal automatic self test, the capacitor discharges, and in step S27, the fault signal ends. Next, in step S28, the shunt timer times out so that in step S29 microcontroller 202 stops the shunting of SCR 135.

However, if an actual fault occurred and microcontroller 202 did not determine the existence of an external fault as described above, then in this condition, the fault signal would continue in step S30 even after the shunt timer timed out. In this case, the shunt timer is only set at a predetermined period of time which is sufficient for a self test fault signal to time out but not sufficient to continue shunting in the event of an actual fault. Therefore, step S31 would next occur resulting in the receipt of a fault signal into the gate of an SCR such as SCR 135. This would result in step S32 which results in the initialization of a trip sequence which involves the activation of SCR 135 to allow current to flow through solenoid 130 causing a pin to fire unlatching contacts 50 and cutting off power to the load. Once contacts 50 have tripped, trip indicator 190 would indicate the condition of the tripped contacts by lighting LED LD1 to indicate that contacts 50 are open.

If no external fault occurs, then the process would proceed from step S29 to step S34 wherein with microcontroller receiving a fault signal within a predetermined period of time such as within the time set forth in step S12, then microcontroller 202 would record a successful self test, and indicate this successful self test in step S34 such as by keeping LED LD2 lit and not illuminating LED LD3. However, if no signal is received in microcontroller 202, such as into pin 8 of microcontroller 202 in FIG. 3, then microcontroller 202 provides indication of this failed self test by not illuminating LED LD 2, and instead illuminating LED LD3. Step S35 can also occur regardless of whether a simulated fault signal is created by transistor Q2 in test circuit 160 and regardless of whether a fault circuit 200 is operating properly. Therefore, a direct line is drawn from step S 16 because once the self test timer times out, if microcontroller 202 does not receive a fault signal, then microcontroller 202 indicates a failed self test. Once microcontroller 202 determines that a failed self test has occurred, in step S36, it starts a timer for a period of time in the future when microcontroller 202 trips contacts 50 in step S37. In this case, microcontroller 202 does not trip or control the tripping of the contacts in the presence of an actual fault signal but rather only after a failed self test, which is determined by microcontroller 202 failing to receive a signal from integrated circuit 200.

If microcontroller 202 is inoperable, the device may continue to operate safely (since GFCI circuitry is still available) but it will fail the manual test since microcontroller 202 will not be able to sense the initiation of the manual test caused by the pressing of the reset button and generate all appropriate signals needed for the test, as discussed above. After that, the device will not be able to reset itself because of the reset lockout features and power will not be provided to the terminals. The user would then need to replace this device.

As described above, the device includes a plurality of different LEDs which are used to provide a plurality of different indication states. LED LD1 can be any color but in at least one embodiment is yellow. This light is not controlled by microcontroller 202 but is rather controlled by contact detector 190 wherein LED LD1 remains lit when a contact coupled to contact detector 190 is in an open position. Contact detector circuit 190 includes contact 51 which is a contact taken from any one of contacts 50 shown in FIGS. 1-3, and a contact post 52 which provides an input into pin 9 of microcontroller 202. In this way, when contact 51 is in an open position, it is in contact with contact post 52 and provides power into pin 9 of microcontroller 202 thereby indicating to microcontroller 202 that the contact is open. In addition, in this state, power is also provided to LED LD1 which lights LED LD1 up indicating that the contacts are open. Power to LED LD1 is controlled entirely based upon the position of the contacts and not based upon the control of microcontroller 202.

LED LD2 is a green LED which indicates whether there was a successful self test. LED LD3 is a red LED which indicates that there has been a failed self test. These LEDs are designed to provide multiple indication states. These indication states are a first indication state indicating that either no power is provided or that the line or load wiring has been reversed. This is indicated by all of the lights LED LD1, LED LD2 and LED LD3 being off. There is a second indication state indicating that there is power but no power provided to the test circuit, and that the contacts have tripped. This is indicated by the presence of a yellow light (LED LD1 being on), and LED LD2 and LED LD3 being off. There is also a third indication state indicating that there is power provided to the device, that the self test has passed, and that the plurality of contacts are latched. This indication state can be shown by a green light formed from LED LD2 and the lack of indication of a yellow light formed by LED LD1 being off. There is also a fourth indication state indicating that there is power provided to the device, that the self test has passed, and that the contacts have tripped. This is formed by LED LD2 being on forming a green light, while LED LD1 which is the yellow light is off. A fifth indication state indicates that the self test has failed, and also indicating that the contacts did not trip successfully. In this case, the red light is on with LED LD3 being on, LED LD2 is on, and LED LD1 is off. Finally, a sixth indication state indicates that the self test has failed and that the plurality of contacts have tripped. This is indicated by LED LD3 being on, providing a red light, LED LD2 is off providing no green light and LED LD1 is on providing a yellow light. These indication states are shown in the table (Table 1) below:

| Micro LED LD2/LD3 | Trip LED (LD1) | Audible Indicator | Meaning |
| --- | --- | --- | --- |
| OFF | OFF | OFF | a) No Power b) Line/Load Reversed c) Loss of Micro or Power Supply and Device Reset |
| OFF | YELLOW | OFF | Loss of Micro or Power Supply and Device Tripped |
| GREEN | OFF | OFF | Self Test Confirms Ok and Device Reset |
| GREEN | YELLOW | OFF | Self-Test Confirms OK and Device Tripped |
| RED | OFF | ON | a) Self Test Failure and Device Reset b) Ground-Fault sensed and contacts did not open |
| RED | YELLOW | OFF | Self Test Failure and Device Tripped |

In this case, Red LED LD3 is a flashing LED, while LED LD2 and LED LD1 are green and yellow are steady state indicators. The Audible indicator indicates the presence of power without protection. This audible indicator can be silenced by tripping the device. If the device has tripped but the contacts have not opened (e.g. welded contacts) holding reset button 170 for several seconds will indicate to the microcontroller to silence the buzzer. Red LED LD3 flashes briefly during the self-test process and when reset button is pressed. In this case, self-test cannot determine the ability of the contacts to open.

Microcontroller 202 can also be programmed to detect a plurality of different errors. For example, microcontroller 202 can detect whether a fault circuit is operating properly such as through a standard self test outlined above. In addition, microcontroller 202 can determine whether any zero crossing circuitry has been lost by reading whether a zero crossing signal is present. The failure of microcontroller 202 to receive any zero crossing signals could be based upon damaged zero crossing circuitry, microcontroller pin damage or damaged bridge rectifier diodes. Microcontroller 202 is also programmed to recognize an overvoltage condition as described above such as when the zero crossing signal is too narrow. In addition, as described above, microcontroller 202 can be used in combination with contact detector circuitry 190 to detect whether a signal is present at pin 9 indicating that the contacts are welded shut, or fail to open in the condition of an actual fault.

Accordingly, while only a few embodiments of the present invention have been shown and described, it is obvious that many changes and modifications may be made thereunto without departing from the spirit and scope of the invention.

What is claimed is:

1. A self testing fault circuit interrupter device comprising:
   a) a fault circuit comprising:
      i) at least one line monitoring circuit;
      ii) at least one line interrupting circuit comprising contacts;
      iii) at least one fault detector circuit which is configured to selectively operate said at least one line interrupting circuit when a fault is detected from said at least one line monitoring circuit;
   b) at least one self test circuit including at least one microcontroller, said at least one self-test circuit configured to conduct a self test on said fault circuit;
   c) at least one timing circuit configured to control a duration of an output of said fault detector circuit;
   d) at least one contact detector circuit to detect whether said contacts are in an open or closed state; and
   e) a first LED coupled to said at least one microcontroller and a second LED coupled to said at least one contact detector circuit.

2. A self testing fault circuit interrupter device comprising:
   a) a fault circuit comprising:
      i) at least one line monitoring circuit;
      ii) at least one line interrupting circuit comprising contacts;
      iii) at least one fault detector circuit which is configured to selectively operate said at least one line interrupting circuit when a fault is detected from said at least one line monitoring circuit;
   b) at least one self test circuit including at least one microcontroller, said at least one self-test circuit configured to conduct a self test on said fault circuit;
   c) at least one timing circuit configured to control a duration of an output of said fault detector circuit; and
   d) at least one indicator circuit for communicating a result of a self test,
   wherein said indicator circuit is configured to indicate at least one of the following states:
      i) a first indication state indicating that either no power is provided to said fault circuit, and said self test circuit, or that a line and load wiring configuration has been reversed;
      ii) a second indication state indicating that there is no power provided to said self test circuit, and that at least one contact of said contacts has tripped;
      iii) a third indication state indicating that there is power provided to the device, that the self test has passed, and that at least one contact is latched;
      iv) a fourth indication state indicating that there is power provided to the device, that the self test has passed, and that at least one contact is open;
      v) a fifth indication state indicating that said self test has failed, and indicating that at least one contact did not open successfully; and
      vi) a sixth indication state indicating that said self test has failed and that at least one contact has opened.

3. The device as in claim 1 or 2, wherein said at least one self test circuit further comprises at least one transistor coupled to an output of said at least one microcontroller.

4. The device as in claim 1 or 2, wherein said at least one fault detector circuit comprises an integrated circuit.

5. The device as in claim 1 or 2, wherein said fault detector circuit further comprises at least one capacitor, wherein said timing circuit is configured to control a discharge rate of said capacitor.

6. The device as in claim 1 or 2, wherein said at least one fault detector circuit is an integrating fault detector circuit.

7. The device as in claim 5, wherein said timing circuit comprises at least one transistor, configured to selectively increase the discharge rate of said capacitor.

8. The device as in claim 7, wherein said timing circuit further comprises at least one resistor, wherein the resistance level of said resistor controls the rate of discharge of said capacitor.

9. The device as in claim 7, wherein said timing circuit is controlled by said at least one microcontroller.

10. The device as in claim 2, wherein said at least one indicator circuit is selected from the group consisting of an audible annunciator, a visible indicator, and a communication circuit.

11. The device as in claim 10, wherein said visible indicator comprises at least one LED configured to display at least one self-test result.

12. The device as in claim 1 or 2, further comprising zero crossing circuitry in communication with said at least one microcontroller, wherein said at least one microcontroller in combination with said zero crossing circuitry forms said line monitoring circuit which is configured to sense an output of said zero crossing circuitry to determine an over voltage condition or an under voltage condition.

13. The device as in claim 1 or 2, wherein said at least one self test circuit is configured to provide a simulated fault signal during at least a portion of a first half cycle and during at least a portion of a second half cycle of opposite polarity.

14. A self testing fault circuit interrupter device comprising:
    a) a fault circuit comprising:
       i) at least one line monitoring circuit;
       ii) at least one line interrupting circuit comprising contacts;
       iii) at least one fault detector circuit which is configured to selectively operate said at least one line interrupting circuit when a fault is detected from said at least one line monitoring circuit;
    b) at least one self test circuit including a microcontroller, said at least one self-test circuit configured to conduct a self test on said fault circuit;
    c) at least one timing circuit configured to control a duration of an output of said fault detector circuit; and
    d) at least one overcurrent detector,
    wherein said microcontroller is configured to perform at least one of the following steps:
    activating said at least one line interrupting circuit when said microcontroller determines an overcurrent condition; and indicating an overcurrent condition when said microcontroller determines an overcurrent condition.

15. A self testing fault circuit interrupter device comprising:
    a) a fault circuit comprising:
       i) at least one line monitoring circuit;
       ii) at least one line interrupting circuit comprising contacts;
       iii) at least one fault detector circuit which is configured to selectively operate said at least one line interrupting circuit when a fault is detected from said at least one line monitoring circuit;
    b) at least one self test circuit including a microcontroller, said at least one self-test circuit configured to conduct a self test on said fault circuit;
    c) at least one timing circuit configured to control a duration of an output of said fault detector circuit; and
    d) at least one temperature sensor coupled to said microcontroller, wherein said microcontroller is configured to activate said at least one line interrupting circuit when said microcontroller determines a temperature has crossed a preset threshold point.

16. A self testing fault circuit interrupter device comprising:
   a) a fault circuit comprising:
      i) at least one line monitoring circuit;
      ii) at least one line interrupting circuit comprising contacts;
      iii) at least one fault detector circuit which is configured to selectively operate said at least one line interrupting circuit when a fault is detected from said at least one line monitoring circuit;
   b) at least one self test circuit including a microcontroller, said at least one self-test circuit configured to conduct a self test on said fault circuit;
   c) at least one timing circuit configured to control a duration of an output of said fault detector circuit; and
   d) at least one fuse coupled to said microcontroller, and to at least one of a phase line or a neutral line, wherein said microcontroller is configured to selectively open a path on said phase line or said neutral line by actuating said fuse.

17. The device as in claim 1 or 2, wherein said at least one fault detection circuit comprises an integrated circuit, wherein said microcontroller is configured to conduct the self test during at least a portion of a positive half cycle and during at least a portion of a negative half cycle of AC current.

18. The device as in claim 1 or 2, wherein said at least one line monitoring circuit comprises at least one sensor.

19. The device as in claim 1 or 2, further comprising:
   a line side coupled to a set of building wiring, providing power to the device;
   a load side coupled to a downstream load,
   a plurality of selectively separable contacts configured to electrically connect/disconnect said line side from said load side;
   wherein said microcontroller is configured to actuate said line interrupting circuit.

20. The self testing fault circuit interrupter device as in claim 12, wherein a level of said over voltage or under voltage is determined based on a slope of the zero crossing output.

21. The self testing fault circuit interrupter device as in claim 20, wherein said microcontroller upon determining an over voltage or under voltage condition is configured to perform at least one of the following tasks: indicate an over voltage or under voltage condition and actuate the at least one line interrupting circuit.

22. The self testing fault circuit interrupter device as in claim 11 wherein said at least one LED comprises a plurality of LEDs and wherein said display of said at least one self test result comprises at least one of: all of said plurality of LEDS off, at least one LED of said plurality of LEDs on, at least two of said plurality of LEDs on all LEDs on, and at least one LED blinking.

23. The device as in claim 1 or 2, wherein said at least one timing circuit is further configured to control a time period of the self test, and to shorten the time period for the self test in the presence of an actual fault.

24. The device as in claim 1 or 2, wherein said at least one line interrupting circuit is selectively activated by said at least one self test circuit when said at least one self test circuit determines that there is a failed self test condition.

* * * * *